(12) United States Patent
Takano

(10) Patent No.: US 10,763,137 B2
(45) Date of Patent: Sep. 1, 2020

(54) SUBSTRATE PROCESSING APPARATUS AND METHOD OF MANUFACTURING SEMICONDUCTOR DEVICE

(71) Applicant: KOKUSAI ELECTRIC CORPORATION, Tokyo (JP)

(72) Inventor: Satoshi Takano, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/542,400

(22) Filed: Aug. 16, 2019

(65) Prior Publication Data
US 2019/0371633 A1    Dec. 5, 2019

Related U.S. Application Data

(63) Continuation of application No. PCT/JP2017/005887, filed on Feb. 17, 2017.

(51) Int. Cl.
    *G03D 5/00* (2006.01)
    *H01L 21/67* (2006.01)
    *C23C 16/44* (2006.01)
    *H01L 21/677* (2006.01)

(52) U.S. Cl.
    CPC .... *H01L 21/67178* (2013.01); *C23C 16/4412* (2013.01); *H01L 21/67184* (2013.01); *H01L 21/67766* (2013.01); *H01L 21/67781* (2013.01)

(58) Field of Classification Search
    USPC .......................................................... 396/611
    See application file for complete search history.

(56) References Cited

U.S. PATENT DOCUMENTS

| | | | | |
|---|---|---|---|---|
| 5,167,716 A | * | 12/1992 | Boitnott | C30B 33/005 118/715 |
| 5,217,501 A | * | 6/1993 | Fuse | C23C 16/54 29/25.01 |
| 5,565,034 A | * | 10/1996 | Nanbu | H01L 21/67173 118/668 |
| 6,042,372 A | * | 3/2000 | Sakata | C23C 16/54 432/241 |
| 6,053,980 A | | 4/2000 | Suda et al. | |
| 6,902,624 B2 | | 6/2005 | Seidel et al. | |

(Continued)

FOREIGN PATENT DOCUMENTS

JP    5-144735 A    6/1993
JP    7-335602 A    12/1995

(Continued)

*Primary Examiner* — Rodney E Fuller
(74) *Attorney, Agent, or Firm* — Volpe and Koenig, P.C.

(57) ABSTRACT

For enhancing productivity, an apparatus comprises a vertical type process furnace configured to simultaneously process N substrates (1<N); a loading chamber provided under the vertical type process furnace and configured to transfer the substrate retainer into or out of the vertical type process furnace; a plurality of single-wafer type process furnaces provided adjacent to the loading chamber, each of the plurality of single-wafer type process furnaces being stacked in at least 2 stages and configured to simultaneously process M substrates (M<N); and a transfer chamber module provided adjacent to the loading chamber and the plurality of single-wafer type process furnaces and provided with a transfer device.

14 Claims, 8 Drawing Sheets

(56) References Cited

U.S. PATENT DOCUMENTS

| | | | |
|---|---|---|---|
| 2004/0120797 A1* | 6/2004 | Paul | H01L 21/67265 |
| | | | 414/217.1 |
| 2006/0090849 A1 | 5/2006 | Toyoda et al. | |
| 2011/0024875 A1* | 2/2011 | Takebayashi | H01L 21/3142 |
| | | | 257/532 |
| 2014/0209024 A1 | 7/2014 | Kim et al. | |
| 2015/0267297 A1 | 9/2015 | Shiba | |
| 2015/0380288 A1* | 12/2015 | Hirano | H01L 21/67379 |
| | | | 438/597 |
| 2019/0006218 A1* | 1/2019 | Toyoda | H01L 21/68771 |
| 2019/0198359 A1 | 6/2019 | Kamimura et al. | |

FOREIGN PATENT DOCUMENTS

| | | |
|---|---|---|
| JP | 8-321470 A | 12/1996 |
| JP | 2000-114184 A | 4/2000 |
| JP | 2014-524657 A | 9/2014 |
| JP | 2016-009724 A | 1/2016 |

* cited by examiner

FIG. 6
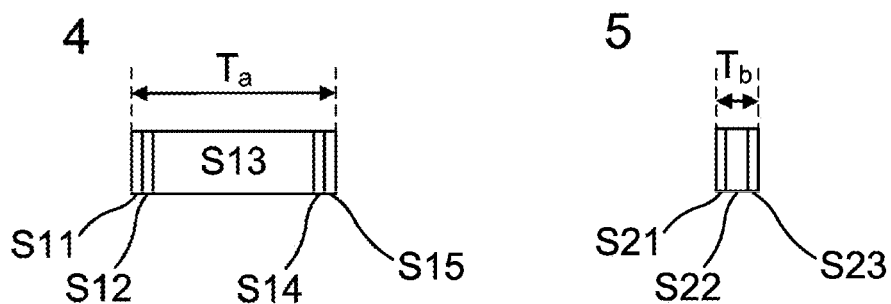
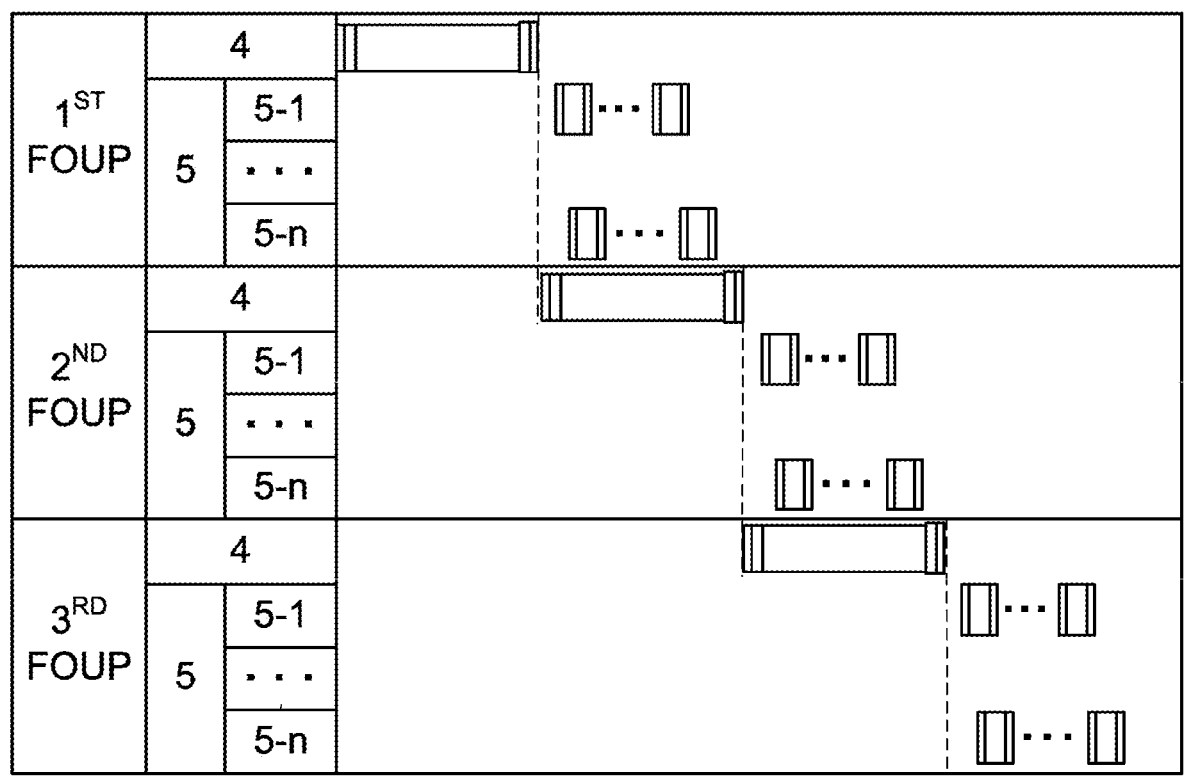

SUBSTRATE PROCESSING APPARATUS AND METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of International Application No. PCT/JP2017/005887, filed on Feb. 17, 2017, in the WIPO, the entire contents of which are hereby incorporated by reference.

BACKGROUND

1. Field

The present disclosure relates to a substrate processing apparatus and a method of manufacturing a semiconductor device.

2. Description of the Related Art

In order to perform a substrate processing in manufacturing processes of a semiconductor device, for example, a single-wafer type processing apparatus configured to process a single substrate at one time or several substrates simultaneously or a vertical type processing apparatus configured to collectively process (that is, batch-processing) several tens of substrates simultaneously may be used. In addition, as an apparatus configured to utilize the feature of such processing apparatus, a processing apparatus capable of processing substrates continuously by the single-wafer type processing apparatus and the vertical type processing apparatus has been proposed, wherein the single-wafer type processing apparatus and the vertical type processing apparatus are connected via a transfer chamber.

However, in the processing apparatus capable of processing the substrates continuously by the single-wafer type processing apparatus and the vertical type processing apparatus, a process time of the single-wafer type processing apparatus is different from a process time of the vertical type processing apparatus. Therefore, a process waiting time may occur in the vertical type processing apparatus. As a result, the overall productivity of the processing apparatus may be reduced.

SUMMARY

Described herein is a technique capable of improving the overall productivity of a processing apparatus configured to process a substrate continuously by a single-wafer type processing apparatus and a vertical type processing apparatus.

According to one aspect of the technique of the present disclosure, there is provided a substrate processing apparatus including: a vertical type process furnace configured to simultaneously process N substrates accommodated in a substrate retainer, where N is a natural number greater than 1; a loading chamber provided under the vertical type process furnace and configured to transfer the substrate retainer into or out of the vertical type process furnace; a plurality of single-wafer type process furnaces provided adjacent to the loading chamber, each of the plurality of single-wafer type process furnaces being stacked in at least 2 stages and configured to simultaneously process M substrates, wherein M is a natural number less than N; a transfer chamber module provided adjacent to the loading chamber and the plurality of the single-wafer type process furnaces and provided with a transfer device configured to transfer the substrates; and a controller configured to operate the vertical type process furnace and the plurality of single-wafer type process furnaces under a condition that a throughput of whole of the plurality of the single-wafer type process furnaces equals or exceeds a throughput of the vertical type process furnace.

BRIEF DESCRIPTION OF THE DRAWINGS

FIG. 6 schematically illustrates a substrate processing performed by using the vertical type process furnace and the single-wafer type process furnace according to the embodiments described herein.

DETAILED DESCRIPTION

Embodiments

Figure 1:
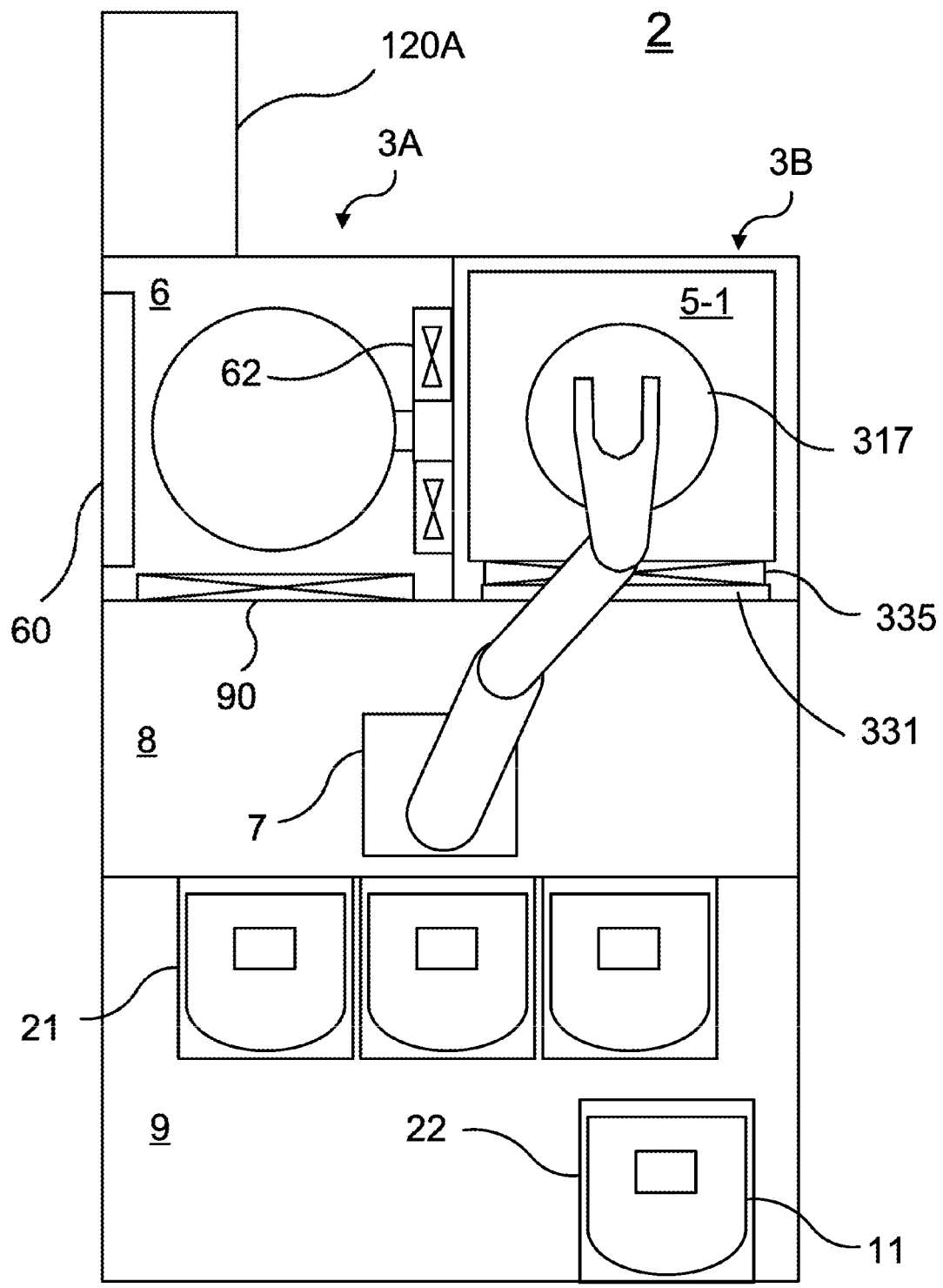
FIG. 1 schematically illustrates a horizontal cross-section of a substrate processing apparatus according to one or more embodiments described herein.

Hereinafter, one or more embodiments (hereinafter, simply referred to as "embodiments") according to the technique of the present disclosure will be described below by way of a non-limiting example with reference to the accompanying drawings. Like reference numerals represent like components in the drawings, and redundant descriptions related thereto will be omitted. In addition, a side where a storage chamber module 9 described later is provided is referred to as a "front side" of an apparatus according to the embodiments, and a side where process modules 3A and 3B described later are provided is referred to as a "rear side" or a "back side". In addition, a side closer to a boundary (also referred to as a "boundary wall" or "adjacent surface") between the process modules 3A and 3B is referred to as an "inner side of an apparatus, and a side more distant from the boundary is referred to as an "outer side of the apparatus".

A substrate processing apparatus (hereinafter, simply referred to as a "processing apparatus") 2 according to the embodiments is configured as a semiconductor manufacturing apparatus that performs, for example, a substrate processing such as a heat treatment process. The substrate processing is performed as one of manufacturing processes in a method of manufacturing a semiconductor device.

Figure 2:
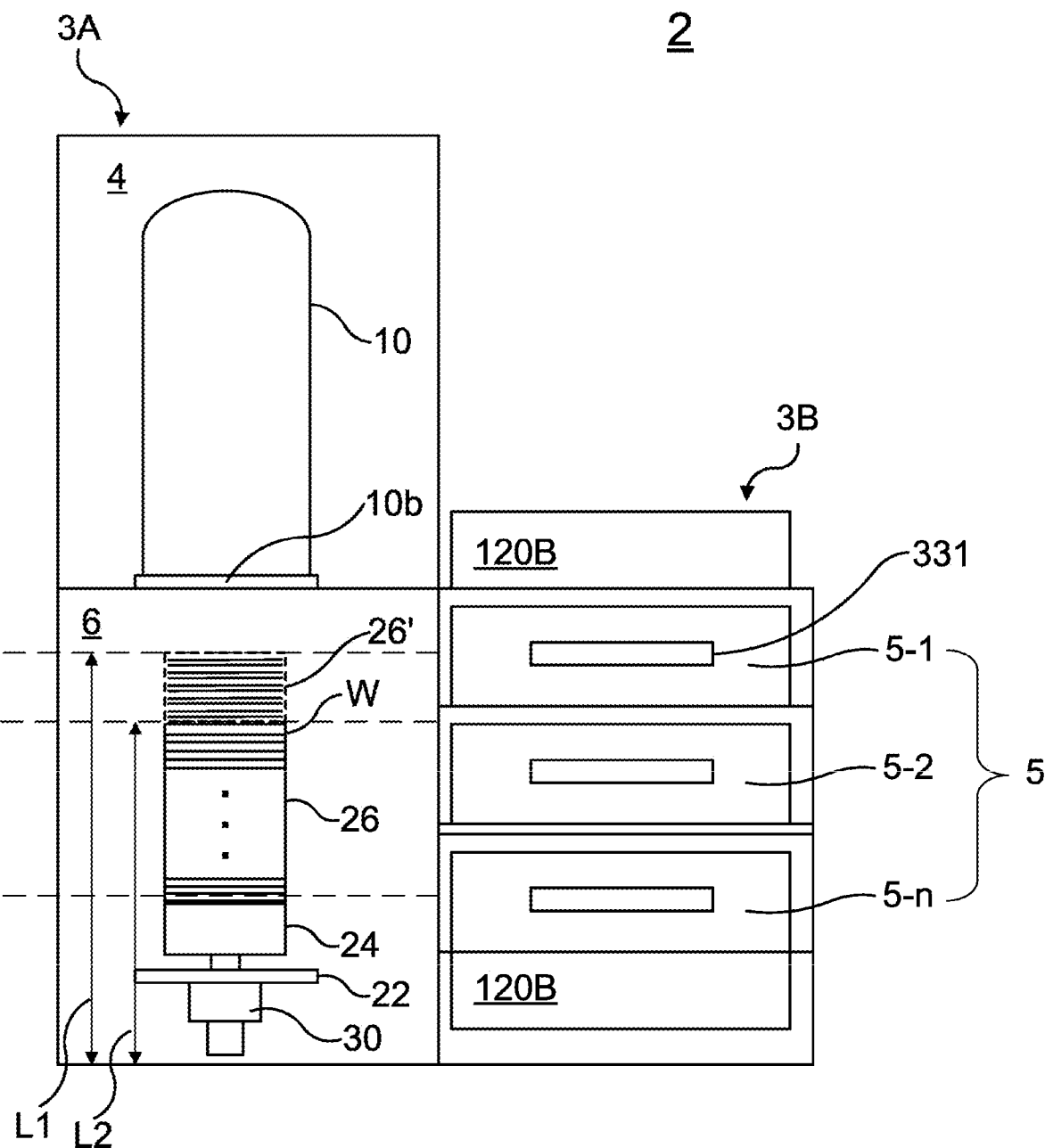
FIG. 2 schematically illustrates a vertical cross-section of the substrate processing apparatus according to the embodiments described herein.

As shown in FIGS. 1 and 2, the processing apparatus 2 includes two process modules 3A and 3B. Each of the process modules 3A and 3B includes a housing (or a body) with a substantially rectangular outline. The process modules 3A and 3B are disposed such that the respective surfaces thereof are adjacent to and parallel to each other. For example, the process module 3A is a vertical type process module configured to collectively process (that is, batch-process) several tens of substrates simultaneously, and includes a vertical type process furnace 4 and a loading chamber 6. The process module 3A is also referred to as a "vertical type processing apparatus". For example, the process module 3B is a single-wafer type process module configured to process a single substrate at one time or several substrates simultaneously, and includes a plurality of single-wafer type process furnaces 5-1 through 5-$n$ ($n$ is a natural number equal to or greater than 2). The process module 3B is also referred to as a "single-wafer type processing apparatus". The loading chamber 6 is disposed under the vertical type process furnace 4.

A transfer chamber module 8 is disposed adjacent to front sides of the loading chamber 6 and the plurality of the single-wafer type process furnaces 5-1 through 5-$n$. The transfer chamber module 8 includes a transfer device 7 capable of transferring a wafer (also referred to as a "substrate") W to be processed. A housing of the transfer chamber module 8 is of a substantially rectangular shape. A transfer chamber is constituted by an interior of the transfer chamber module 8. The storage chamber module 9 configured to temporarily store a pod (also referred as a "FOUP") 11 is provided at a front side of the transfer chamber module 8. The storage chamber module 9 serves as a storage container where a plurality of wafers including the wafer W is accommodated. An I/O port 22 is installed on an upper surface or a front surface of the storage chamber module 9, and the pod 11 is transferred (loaded) into the processing apparatus 2 or transferred (unloaded) out of the processing apparatus 2 through the I/O port 22. At least a portion of a housing of the storage chamber module 9 is of a substantially rectangular shape. As described above, the process modules 3A and 3B, the transfer chamber module 8 and the storage chamber module 9 are of a polyhedron-based shape whose surfaces are orthogonal to each other, and are configured to be detachable from the counterpart at connection portions (also referred to as a "connection components"). The connection portions appropriately maintain the process modules 3A and 3B, the transfer chamber module 8 and the storage chamber module 9 to be appropriately airtight.

Figure 4:
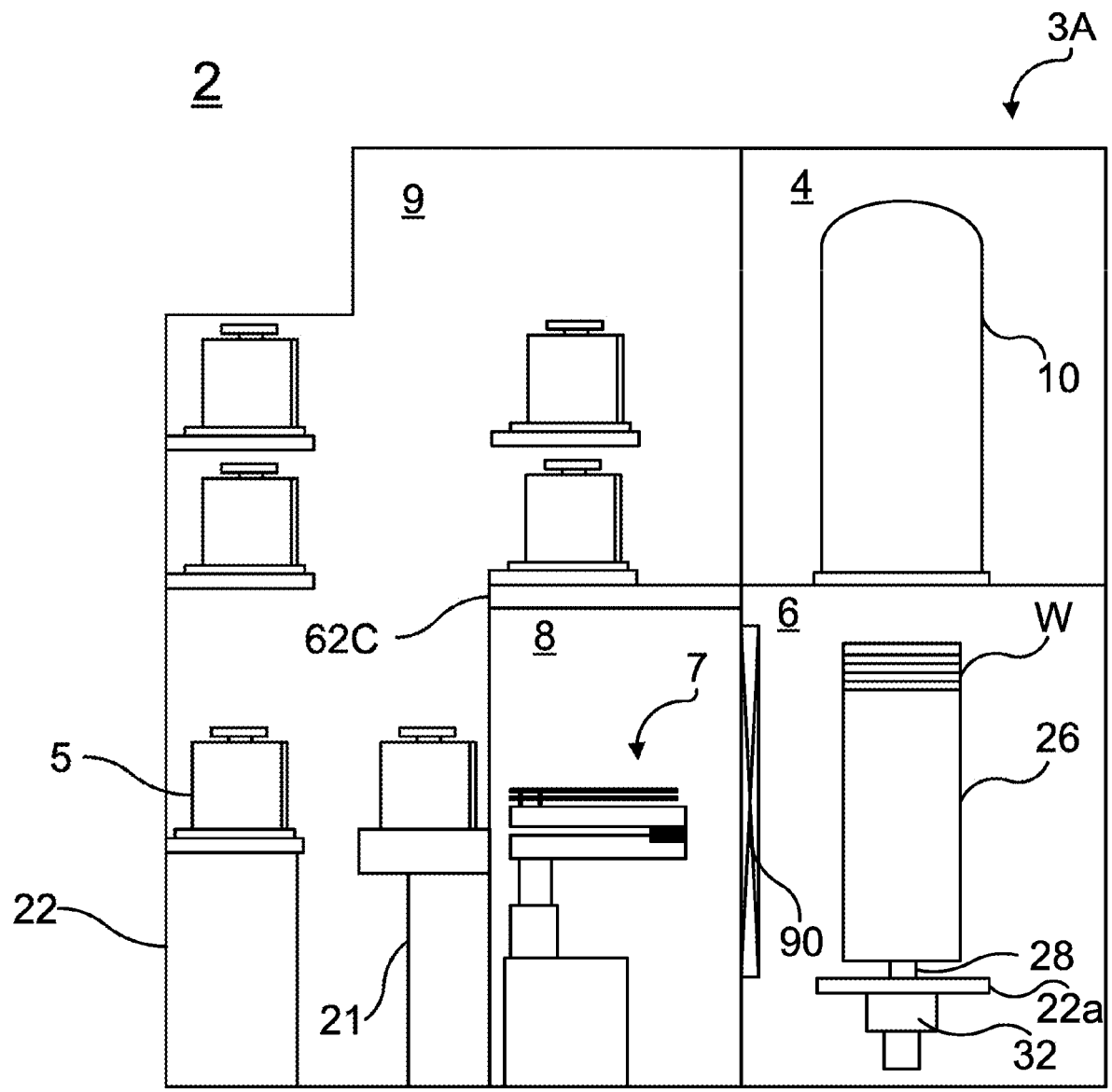
FIG. 4 schematically illustrates another vertical cross-section of the substrate processing apparatus according to the embodiments described herein.

A gate valve 90 serving as an isolation part is provided at a boundary (adjacent surface) between the loading chamber 6 and the transfer chamber module 8. A gate valve 335 is provided at a boundary between the transfer chamber module 8 and the plurality of the single-wafer type process furnaces 5-1 through 5-$n$. Pressure detectors (not shown) are respectively provided in the transfer chamber module 8 and the loading chamber 6, and an inner pressure of the transfer chamber module 8 may be set (adjusted) to be lower than an inner pressure of the loading chamber 6 near the atmospheric pressure. In addition, oxygen concentration detectors (not shown) are respectively provided in the transfer chamber module 8 and the loading chamber 6, and oxygen concentrations in the transfer chamber module 8 and the loading chamber 6 are maintained lower than an oxygen concentration in the atmosphere. It is possible that the oxygen concentrations in the transfer chamber module 8 and the loading chamber 6 are maintained equal to or less than 30 ppm, preferably less than 20 ppm for avoiding oxidation of the wafer W. As shown in FIG. 4, a clean air supply mechanism 62C is provided at a ceiling portion of the transfer chamber module 8. The clean air supply mechanism 62C is configured to supply clean air such as a filtered inert gas and to circulate the clean air in the transfer chamber module 8. By circulating and purging an inside of the transfer chamber module 8 with the inert gas, it is possible to maintain a clean state of an inner atmosphere of the transfer chamber module 8. According to the configurations of the components such as the clean air supply mechanism 62C described above, it is possible to prevent particles and the like in the loading chamber 6 and the plurality of the single-wafer type process furnaces 5-1 through 5-$n$ from entering the transfer chamber module 8. It is also possible to suppress the formation of a natural oxide film on the wafer W in the transfer chamber module 8 and the loading chamber 6. Three loading port shelves 21 configured to open and close a lid of the pod 11 are provided in a rear area of the storage chamber module 9 on a boundary wall between the storage chamber module 9 and the transfer chamber module 8. The loading port shelves 21 is compliant with FIMS (Front-opening Interface Mechanical Standard) and also referred to as a pod opener. While the lid of the pod 11 is opened by one of the three loading port shelves 21, the wafer W in the pod 11 may be transferred to the transfer chamber module 8 or the wafer W in the transfer chamber module 8 may be transferred to the pod 11.

The transfer device 7 includes an articulated robot (also referred to as a "multi-joint robot") operating at the atmospheric pressure. A first arm, a second arm and end effectors are provided sequentially in this order from a front end of an elevation shaft of the transfer device 7. A first joint at a base of the first arm, a second joint between the first arm and the second arm and a third joint between the second arm and the end effectors are at least horizontally rotatable. Since a length of the first arm is greater than half of a depth (length in a front-rear direction) of the transfer chamber module 8, the first arm cannot rotate all around in the transfer chamber module 8. The elevation shaft and the first joint are provided at a front portion of the transfer chamber module 8. When the transfer device 7 approaches (accesses) a single-wafer type process furnace among the plurality of the single-wafer type process furnaces 5-1 through 5-$n$ which is the farthest from the elevation shaft, the transfer device 7 moves the end effectors in the front-rear direction (that is, moves the end effectors back and forth) while maintaining the second joint being bent into the inner side of the apparatus. That is, the transfer device 7 moves the end effectors with the second arm and the end effectors (or the first arm) not along a straight line. According to the operation of the transfer device 7 described above, the end effectors of the transfer device 7 can access pods including the pod 11 placed on all of the three loading port shelves 21, the loading chamber 6, and the plurality of the single-wafer type process furnaces 5-1 through 5-$n$. In order for the end effectors to easily pass through, a width of the gate valve 335 or a width of a transfer path 331 which will be described later may be set to a considerably large width as compared with a diameter of the wafer W, and the gate valve 335 or the transfer path 331 may be disposed at the inner side of the apparatus.

<Vertical Type Process Module>

Figure 3:
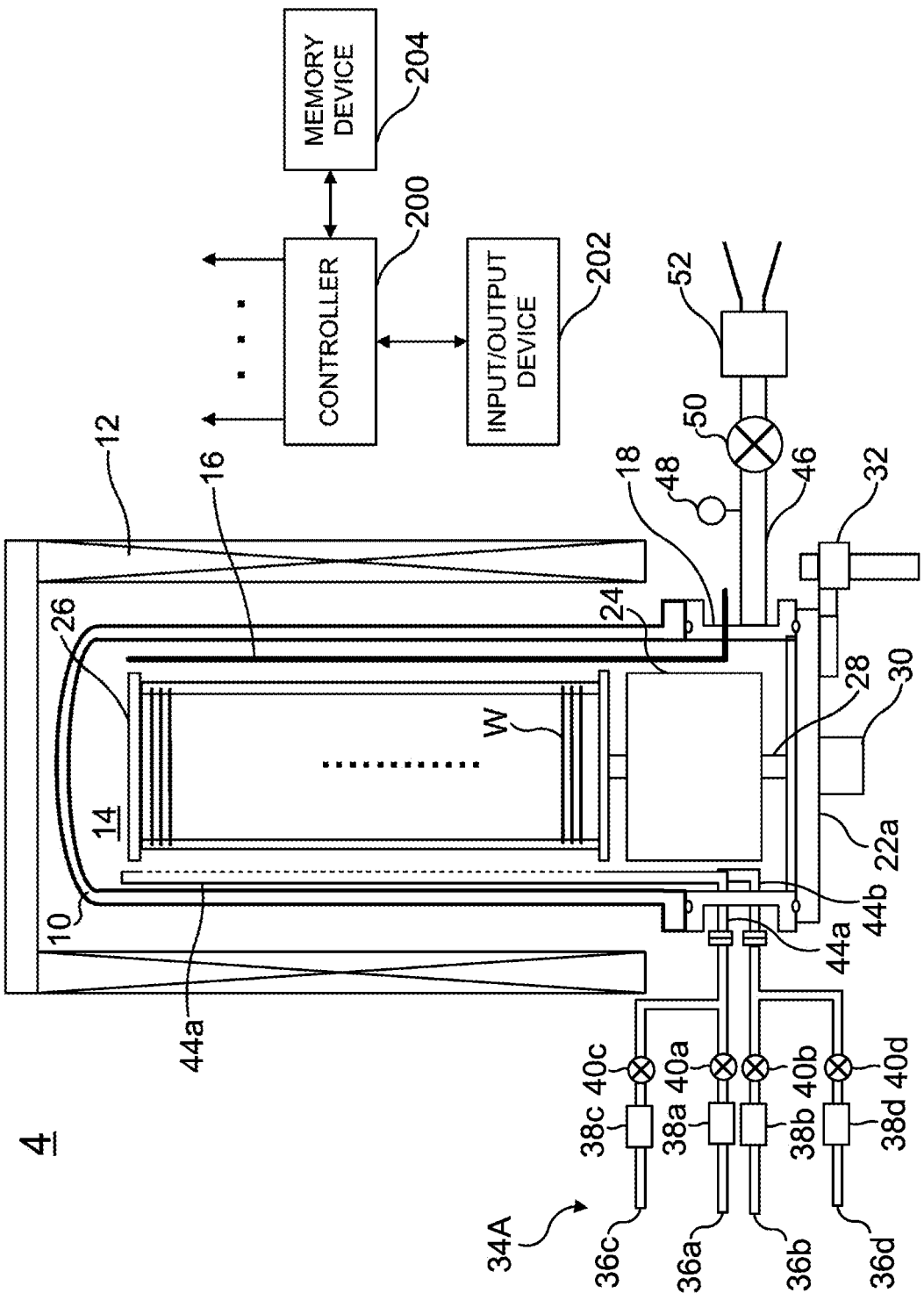
FIG. 3 schematically illustrates a vertical cross-section of a vertical type process furnace of the substrate processing apparatus according to the embodiments described herein.

The vertical type process furnace 4 is provided in the vertical type process module (that is, the process module 3A). The vertical type process furnace 4 is configured to process N substrates (N is a natural number greater than 1, preferably greater than 5 and less than 51) simultaneously. As shown in FIG. 3, the vertical type process furnace 4 includes a reaction tube 10 of a cylindrical shape and a heater 12 serving as a heating device (heating mechanism) provided at an outer periphery of the reaction tube 10. The reaction tube 10 is made of a material such as quartz and silicon carbide (SiC). A process chamber (also referred to as a "vertical type process chamber) 14 in which the wafer W serving as a substrate is processed is provided in the reaction tube 10. A temperature detector 16 is provided in the reaction tube 10. The temperature detector 16 is provided vertically along an inner wall of the reaction tube 10.

A manifold 18 of a cylindrical shape is connected to a lower end opening of the reaction tube 10 via a sealing part such as an O-ring. The manifold 18 supports a lower end of the reaction tube 10. A lower end opening 10b of the manifold 18 is located to face a ceiling portion of the loading chamber 6, and is opened or closed by a lid 22 of a disk shape. A sealing part such as an O-ring is provided on an upper surface of the lid 22 so that an inner atmosphere of the reaction tube 10 is hermetically (airtightly) sealed from an outside atmosphere (air). A boat 26 serving as a substrate retainer described later is placed on the lid 22 via a heat insulating portion (also referred to as a "heat insulating part") 24.

The process chamber 14 is configured to accommodate the boat 26 serving as a substrate retainer therein. The boat 26 is configured to support the plurality of the wafers including the wafer W, for example, from 10 to 50 wafers in the vertical direction in a multistage manner. The boat 26 is made of a material such as quartz and SiC. The boat 26 is supported above the heat insulating portion 24 by a rotating shaft 28 passing through the lid 22 and the heat insulating portion 24. The rotating shaft 28 is connected to a rotating mechanism 30 provided below the lid 22. The rotating mechanism 30 is configured to rotate the rotating shaft 28 while maintaining the inner atmosphere of the reaction tube 10 to be hermetically sealed. The lid 22 may be moved upward or downward in the vertical direction by a boat elevator 32 serving as an elevating mechanism. Thereby, the boat 26 and the lid 22 are jointly elevated or lowered from a home position, and the boat 26 is transferred (loaded or unloaded) between the loading chamber 6 and the reaction tube 10. In the present specification, the term "home position" refers to a position where the boat 26 is in the loading chamber 6 and the wafer W is transferred to the boat 26.

Gases used for the substrate processing are supplied into the process chamber 14 by a gas supply mechanism 34A serving as a gas supply system. The gases supplied by the gas supply mechanism 34A may be changed according to a type of a film to be formed. In the embodiments, the gas supply mechanism 34A includes a source gas supply mechanism (also referred to as a "source gas supply system"), a reactive gas supply mechanism (also referred to as a "reactive gas supply system") and an inert gas supply mechanism (also referred to as an "inert gas supply system").

The source gas supply mechanism includes a gas supply pipe 36a. A mass flow controller (MFC) 38a serving as a flow rate controller (flow rate control mechanism) and a valve 40a serving as an opening/closing valve are sequentially installed at the gas supply pipe 36a from an upstream side to a downstream side of the gas supply pipe 36a. The gas supply pipe 36a is connected to a nozzle 44a penetrating a side wall of the manifold 18. The nozzles 44a is provided vertically in the reaction tube 10. A plurality of gas supply holes is provided at the nozzles 44a. The plurality of the gas supply holes of the nozzles 44a is opened toward the plurality of the wafers including the wafer W supported by the boat 26 serving as a substrate retainer. A source gas is supplied to the plurality of the wafers including the wafer W through the plurality of the gas supply holes of the nozzle 44a.

Similar to the source gas supply mechanism, a reactive gas is supplied to the plurality of the wafers including the wafer W from the reaction gas supply mechanism through a gas supply pipe 36b, a MFC 38b, a valve 40b and a nozzle 44b. An inert gas is supplied to the plurality of the wafers including the wafer W from the inert gas supply mechanism through gas supply pipes 36c and 36d, MFCs 38c and 38d, valves 40c and 40d and the nozzles 44a and 44b.

An exhaust pipe 46 is provided at the manifold 18. A vacuum pump 52 serving as a vacuum exhaust apparatus is connected to the exhaust pipe 46 through a pressure sensor 48 and an APC (Automatic Pressure Controller) valve 50. The pressure sensor 48 serves as a pressure detector (also referred to as a "pressure detection mechanism") configured to detect an inner pressure of the process chamber 14, and the APC valve 50 serves as an pressure controller (also referred to as a "pressure adjusting mechanism"). According to the configurations of the exhaust pipe 46, the pressure sensor 48, APC valve 50 and the vacuum pump 52 described above, it is possible to set (adjust) the inner pressure of the process chamber 14 to a processing pressure according to the substrate processing. An exhaust system is constituted mainly by the exhaust pipe 46, the APC valve 50 and the pressure sensor 48. The exhaust system may be accommodated (housed) in an exhaust box (not shown).

As shown in FIG. 1, a clean air supply mechanism 60 is provided in the loading chamber 6 at a side surface of the loading chamber 6 (at the outer side of the apparatus). The clean air supply mechanism 60 is configured to supply clean air (for example, an inert gas) and to circulate the clean air in the loading chamber 6. The inert gas supplied into the loading chamber 6 is exhausted from the inside of the loading chamber 6 by an exhaust mechanism 62, and is supplied again into the loading chamber 6 through the clean air supply mechanism 60 (circulating and purging the inert gas). The exhaust mechanism 62 is provided on a side surface of the loading chamber 6 facing the clean air supply mechanism 60 with the boat 26 interposed therebetween. That is, the exhaust mechanism 62 is provided on the side surface facing the process module 3B. The inner pressure of the loading chamber 6 may be set to be slightly higher than both of the inner pressure of the transfer chamber module 8 and the atmospheric pressure. In addition, the oxygen concentration in the loading chamber 6 is set to be lower than the oxygen concentration in the outside atmosphere (air). According to the configuration of the clean air supply mechanism 60, it is possible to suppress the formation of a natural oxide film on wafer W during a transfer operation of the wafer W.

A height of the loading chamber 6 is set such that the loading chamber 6 can be applied to at least two types of boats capable of supporting (accommodating) different numbers of wafers. For example, in case of using the boat 26 capable of supporting N wafers including the wafer W, a volume of the loading chamber 6 is set such that it is large enough to accommodate a boat 26' capable of supporting 2N wafers (that is, twice as many wafers as N wafers supported by the boat 26) including the wafer W. As shown in FIG. 2, when "L1" indicates a height from a floor surface of the loading chamber 6 to an upper end of the boat 26' capable of supporting 2N wafers and "L2" indicates a height from the floor surface of the loading chamber 6 to an upper end of the boat 26 capable of supporting N wafers, the height of the loading chamber 6 is set at least higher than L1. In addition, a height of the reaction tube 10 or the heater 12 may be set in consideration of the height of the boat 26' so that the boat 26' can be used.

In the embodiments, a height of the transfer device 7 is set such that the transfer device 7 may be moved up and down in at least two types of the boats capable of supporting (accommodating) different numbers of wafers, and the gate valve 90 can be opened to a sufficient height so as not to hinder the movement of the transfer device 7. That is, the transfer device 7 can be driven from a height position at which the wafer W is transferred to a lowermost end of the boat 26' to a height position at which the wafer W is transferred to an uppermost end of the boat 26'. According to the configuration of the transfer device 7 described above, even when the type of the boat used in the vertical type process furnace 4 is changed, there is no need to change the transfer device 7, so the platform of the vertical type process furnace 4 can remain as it is. Therefore, it is possible to reduce the cost even when the type of the boat is changed.

A utility module 120A is provided on a back side of the loading chamber 6 (that is, a rear side of the process module 3A). The utility module 120A is configured to accommodate components such as the gas supply mechanism 34A of the vertical type process furnace 4 and an exhaust mechanism of the vertical type process furnace 4.

<Single-Wafer Type Process Module>

As shown in FIG. 2, in the single-wafer type process module 3B, the plurality of the single-wafer type process furnaces 5-1 through 5-$n$ ($n$ is a natural number equal to or greater than 2) is provided (arranged) vertically in n stages at positions corresponding to the loading chamber 6. The plurality of the single-wafer type process furnaces 5-1 through 5-$n$ is disposed within a vertical range whose upper limit is of the same height as or lower than an upper end of the loading chamber 6 and whose lower limit is of the same height as or higher than a lower end of the loading chamber 6. Hereinafter, the plurality of the single-wafer type process furnaces 5-1 through 5-$n$ is collectively or individually referred to as a single-wafer type process furnace 5 since it is assumed that the configurations of the plurality of the single-wafer type process furnaces 5-1 through 5-$n$ are the same.

Figure 5:
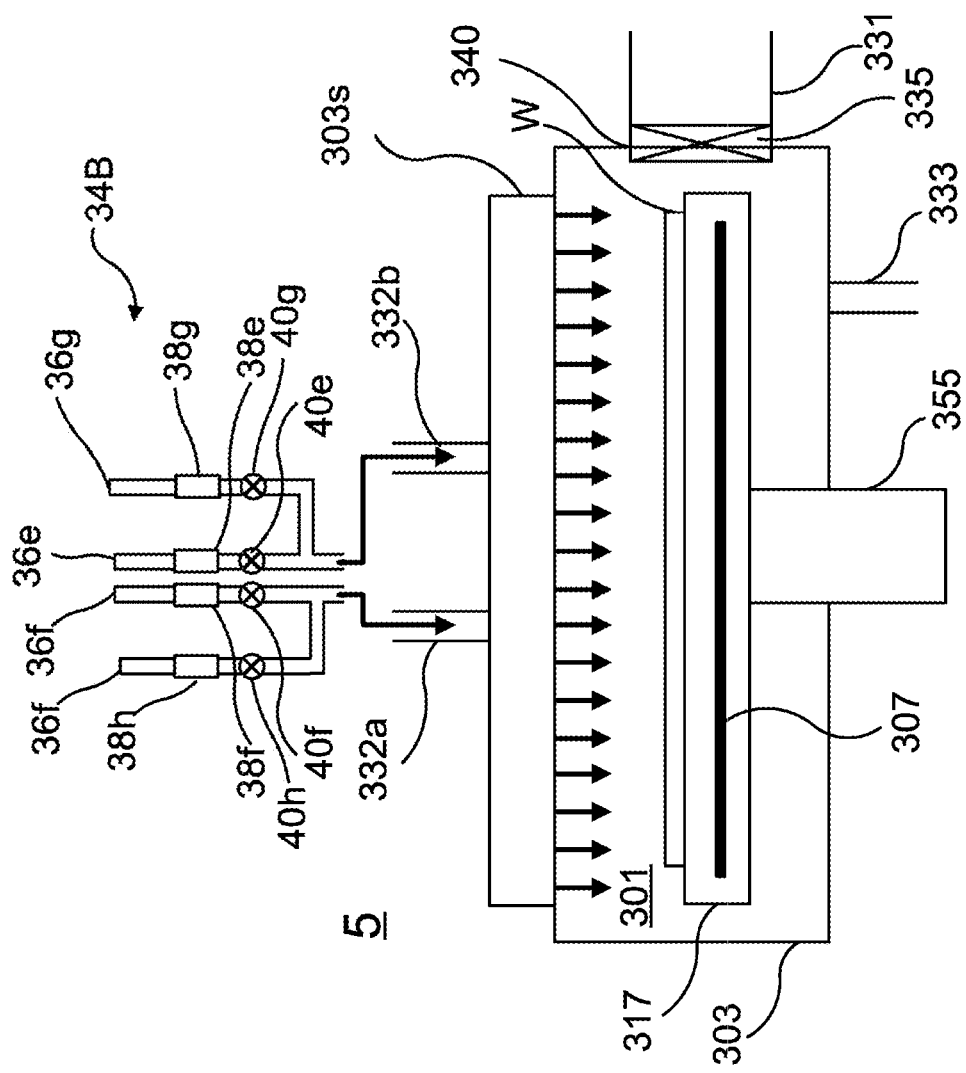
FIG. 5 schematically illustrates a vertical cross-section of a single-wafer type process furnace of the substrate processing apparatus according to the embodiments described herein.

As shown in FIG. 5, the single-wafer type process furnace 5 includes: a process vessel 303 accommodating a process chamber 301 therein; a shower head 303$s$ configured to shower the gases into the process chamber 301; a susceptor 317 configured to support the wafer W or wafers of M ($1 \leq M < 7$) on a horizontal plane; a rotating shaft 355 configured to support the susceptor 317 from underneath; and a heater 307 provided in the susceptor 317. The susceptor 317 or rotation table can support 3 to 6 wafers effectively in round arrangement. In contrast, wafers above 7 notably decrease the efficiency of arrangement in a geometric reason.

The gases used for the substrate processing is supplied into the process chamber 301 by a gas supply mechanism 34B serving as a gas supply system. The gases supplied by the gas supply mechanism 348 may be changed according to the contents of the substrate processing. In the embodiments, the gas supply mechanism 34B includes a source gas supply mechanism (also referred to as a "source gas supply system"), a reactive gas supply mechanism (also referred to as a "reactive gas supply system") and an inert gas supply mechanism (also referred to as an "inert gas supply system"). Similar to the gas supply mechanism 34A, the source gas supply mechanism of the gas supply mechanism 34B includes a gas supply pipe 36$e$, an MFC 38$e$ and a valve 40$e$, the reactive gas supply mechanism of the gas supply mechanism 34B includes a gas supply pipe 36$f$, an MFC 38$f$ and a valve 40$f$; and the inert gas supply mechanism of the gas supply mechanism 34B includes gas supply pipes 36$g$ and 36$h$, MFCs 38$g$ and 38$h$ and valves 40$g$ and 40$h$.

A gas supply port 332$a$ configured to supply the source gas described above and a gas supply port 332$b$ configured to supply the reactive gas described above are connected to an inlet (gas introduction port) of the shower head 303$s$. The reactive gas supply mechanism and the inert gas supply mechanism described above are connected to the gas supply port 332$a$. The source gas supply mechanism and the inert gas supply mechanism described above are connected to the gas supply port 332$b$. A gas distribution plate (not shown) configured to shower the gases into the process chamber 301 is provided at an outlet (gas discharge port) of the shower head 303$s$. An exhaust port 333 configured to exhaust an inner atmosphere of the process chamber 301 is provided at the process vessel 303. An exhaust system (not shown) similar to that of the vertical type process furnace 4 is connected to the exhaust port 333.

The transfer path 331 wherethrough the wafer W is transferred into and out of the process chamber 301 is provided at a side surface of the process vessel 303. A substrate loading/unloading port 340 is provided at the side surface of the process vessel 303 (that is, a side of the single-wafer type process furnace 5 facing the transfer chamber module 8). The gate valve 335 is provided in the middle of the transport path 331, and is configured to withstand a pressure difference of 1 atmospheric pressure or more. One end of the transfer path 331 is pressed against an outer wall of the transfer chamber module 8 via a sealing part, and is opened in the transfer chamber 8. When the gate valve 335 is closed, an inner atmosphere of the process vessel 303 and the inner atmosphere of the transfer chamber module 8 are hermetically sealed from each other. That is, in the embodiments, when the gate valve 335 is opened, the process vessel 303 is always connected to the transfer chamber module 8 whose inner pressure is near the atmospheric pressure without passing through a vacuum load lock chamber (not shown).

A utility module 120B is provided on an upper surface of the process module 3B or under the single-wafer type process furnace 5-$n$ of the process module 3B in an integrated manner. The utility module 120B is configured to accommodate components such as the gas supply mechanism 34B of the single-wafer type process furnace 5 and an exhaust mechanism of the single-wafer type process furnace 5. The plurality of the single-wafer type process furnaces 5-1 through 5-$n$ may be individually pulled out to a back side of the process module 3B using a component such as a slide mechanism. By securing a wide maintenance area on the back side of the processing apparatus 2, it is possible to improve the workability.

The substrate loading/unloading port 340 of the single-wafer type process furnace 5 is provided lower than the lower end opening 10$b$ of the vertical type process furnace 4. Specifically, the transport path 331 (that is, the substrate loading/unloading port 340) of the uppermost single-wafer type process furnace 5-1 of the process module 3B is provided (disposed) lower than the upper end of the loading chamber 6 (that is, the ceiling portion of the loading chamber 6). That is, the transport path 331 of the uppermost single-wafer type process furnace 5-1 is provided within a vertical range lower than the lower end opening 10$b$ of the vertical type process furnace 4. The transport path 331 of the uppermost single-wafer type process furnace 5-1 may be provided within a vertical range as high as or higher than the upper end of the boat 26. Alternatively, the transport path 331 of the uppermost single-wafer type process furnace 5-1 may be provided within a vertical range as high as or higher than the upper end of the boat 26' (that is, the transport path 331 of the uppermost single-wafer type process furnace 5-1 is provided within a vertical range above the boat 26'). Alternatively, the transport path 331 of the uppermost single-wafer type process furnace 5-1 may be provided within a vertical range whose upper limit is of the same height as or higher than the upper end of the boat 26 and whose lower limit is of the same height as or lower than the upper end of the boat 26'. In other words, the transport path 331 of the uppermost single-wafer type process furnace 5-1 is provided within a vertical range between the upper end of the boat 26 and the upper end of the boat 26'. In addition, the transfer path 331 (that is, the substrate loading/unloading port 340) of the lowermost single-wafer type process furnace 5-n is disposed within a vertical range as high as or higher than the lowermost wafer of the plurality of the wafers accommodated in the boat 26.

Components such as the transfer device 7, the heaters 12 and 307, the rotating mechanism 30, the boat elevator 32, the MFCs 38a through 38h, the valves 40a through 40h, the APC valve 50, the gate valves 90 and 335 and the rotating shaft 355 are connected to a controller 200 and controlled by the controller 200. For example, the controller 200 is embodied by a microprocessor (computer) with a CPU (central processing unit), and is configured to control the operations of the processing apparatus 2. An input/output device 202 such as a touch panel is connected to the controller 200. The controller 200 may be provided individually to the process module 3A and the process module 3B, or may be provided in common to the process module 3A and the process module 3B.

A memory device 204 serving as a recording medium is connected to the controller 200. A control program for controlling the operations of the processing apparatus 2 or a program (also referred to as a "recipe") configured to control the components of the processing apparatus 2 according to the process conditions to perform the substrate processing is readably stored in the memory device 204.

The memory device 204 may be embodied by a built-in memory device (such as a hard disk and a flash memory) of the controller 200, or may be embodied by a portable external recording device (for example, a magnetic tape, a magnetic disk such as a flexible disk and a hard disk, an optical disk such as a CD and a DVD, a magneto-optical disk such as an MO, and a semiconductor memory such as a USB memory and a memory card). The program may be provided to the computer using a communication means such as the Internet and a dedicated line. The program is read from the memory device 204 in accordance with an instruction inputted from the input/output device 102 when necessary. By executing the substrate processing by the controller 200 according to the read recipe, the processing apparatus 2 performs a desired processing (that is, the substrate processing) under the control of the controller 200. The controller 200 may be accommodated (housed) in a controller box (not shown).

Hereinafter, an example of the substrate processing of processing the substrate (wafer) continuously by the vertical type processing process furnace 4 and the single-wafer type process furnace 5 will be described with reference to FIG. 6. The substrate processing is performed by using the above-described processing apparatus 2. Hereinafter, the components of the processing apparatus 2 are controlled by the controller 200.

<Step S11>

In the step S11, for example, the wafer W is transferred to the boat 26 capable of supporting the plurality of the wafers (for example, 25 wafers) in top-to-bottom order. After it is confirmed that the oxygen concentrations in the transfer chamber module 8 and the loading chamber 6 are maintained equal to or less than 30 ppm, the gate valve 90 is opened and the plurality of the wafers including the wafer W is transferred (loaded) into the boat 26. After the plurality of the wafers is loaded into the boat 26 (wafer charging), the gate valve 90 is closed.

<Step S12>

In the step S12, the boat 26 is transferred (loaded) into the process chamber 14 (boat loading). The boat 26 is loaded into the process chamber 14 by the boat elevator 32. The lower end opening of the reaction tube 10 is hermetically sealed (closed) by the lid 22.

<Step S13>

In the step S13, a predetermined substrate processing (that is, the substrate processing) is performed on the plurality of the wafers including the wafer W. For example, by supplying DCS ($SiH_2Cl_2$: dichlorosilane) gas serving as the source gas and oxygen ($O_2$) gas serving as a reaction gas to wafer W, a silicon oxide ($SiO_2$) film is formed on the wafer W. In the step S13, a vertical structure such as a via and a trench with an aspect ratio greater than 100 and a cavity extending horizontally from the vertical structure are formed on the wafer W. It is necessary to uniformly form the silicon oxide film on surfaces of the vertical structure and the cavity. In general, the formation of the silicon oxide film described above is performed at a very low film-forming rate due to limit of Knudsen diffusion or surface diffusion. The formation of the silicon oxide film requires 12 hours or more, for example. For example, the step S13 includes a source gas supplying step, a source gas exhaust step, a reactive gas supplying step and a reactive gas exhaust step which are described below.

<Source Gas Supplying Step>

After an inner temperature of the process chamber 14 is stabilized at a predetermined process temperature by the heating of the heater 12, the DCS gas is supplied to the wafer W in the process chamber 14. A flow rate of the DCS gas is adjusted (controlled) by the MFC 38a to a desired flow rate, and the DCS gas with the flow rate thereof adjusted is then supplied into the process chamber 14 through the gas supply pipe 36a and the nozzle 44a.

<Source Gas Exhaust Step>

Next, the supply of the DCS gas is stopped, and the vacuum pump 52 vacuum-exhausts an inner atmosphere of the process chamber 14. In the source gas exhaust step, $N_2$ gas serving as the inert gas may be supplied into the process chamber 14 though the inert gas supply mechanism (purging by inert gas).

<Reactive Gas Supplying Step>

Next, the $O_2$ gas is supplied to the wafer W in the process chamber 14. A flow rate of the 02 gas is adjusted (controlled) by the MFC 38b to a desired flow rate, and the 02 gas with the flow rate thereof adjusted is then supplied into the process chamber 14 through the gas supply pipe 36b and the nozzle 44b.

<Reactive Gas Exhaust Step>

Next, the supply of the $O_2$ gas is stopped, and the vacuum pump 52 vacuum-exhausts the inner atmosphere of the process chamber 14. In the reactive gas exhaust step, the $N_2$ gas serving as the inert gas may be supplied into the process chamber 14 though the inert gas supply mechanism (purging by inert gas).

By performing a cycle including the source gas supplying step, the source gas exhaust step, the reactive gas supplying step and the reactive gas exhaust step a predetermined number of times (at least once), it is possible to form the $SiO_2$ film with a predetermined composition and a predetermined thickness on the surface of the wafer W.

For example, process conditions when the $SiO_2$ film is formed on the wafer W are as follows:

The process temperature (wafer temperature): 300° C. to 700° C.;

The pressure (the inner pressure of the process chamber 14): 1 Pa to 4,000 Pa;

The flow rate of the DCS gas: 100 sccm to 10,000 sccm;

The flow rate of the $O_2$ gas: 100 sccm to 10,000 sccm; and

The flow rate of the $N_2$ gas: 100 sccm to 10,000 sccm.

By selecting suitable values within the process conditions described above, it is possible to perform a film-forming process of the substrate processing properly.

<Step S14>

In the step S14, the boat 26 is transferred (unloaded) out of the reaction tube 10 (boat unloading). Specifically, after the $SiO_2$ film is formed with the predetermined thickness, the $N_2$ gas is supplied into the process chamber 14 though the inert gas supply mechanism. The inner atmosphere of the process chamber 14 is replaced with the $N_2$ gas, and the inner pressure of the process chamber 14 is returned to a normal pressure (that is, the atmospheric pressure). Thereafter, the lid 22 is lowered by the boat elevator 32, and the boat 26 is unloaded out of the reaction tube 10.

<Step S15>

In the step S15, after it is confirmed that the oxygen concentration in the transfer chamber module 8 is maintained equal to or less than 30 ppm, the gate valve 90 is opened. The plurality of the processed wafers including the processed wafer W is transferred (unloaded) out of the boat 26 in bottom-to-top order, and is stored in the FOUP 11, where FOUP 11 may have a upper-temperature limit of above 80° C. In the process module 3A, when the step S15 is completed, the steps S11 through S15 may be performed again to process a plurality of wafers including the next wafer W.

<Step S21>

In the step S21, the wafer W processed in the vertical type process furnace 4 and stored in the FOUP 11 is transferred to an empty single-wafer type process furnace among the plurality of the single-wafer type process furnaces 5-1 through 5-n. For example, the wafer W is transferred to the single-wafer type process furnace 5-1. Specifically, after it is confirmed that the oxygen concentration in the transfer chamber module 8 is maintained equal to or less than 30 ppm, the gate valve 355 of the single-wafer type process furnace 5-1 is opened and the wafer W is transferred (loaded) into the process chamber 301 of the single-wafer type process furnace 5-1 by the transfer device 7. Thereafter, the gate valve 335 of the single-wafer type process furnace 5-1 is closed. When the transfer of the wafer W to the single-wafer type process furnace 5-1 is completed, the other wafers among the plurality of the processed wafers are sequentially transferred to the empty single-wafer type process furnace 5-2 through 5-n. Besides, a part of the step S15 and a part of the step S22 could be performed at once, that is, one of the wafers might be transferred directly from the boat 26 to the single-wafer type process furnace 5-1 or the like.

<Step S22>

A predetermined substrate processing (that is, the substrate processing) is performed on the wafer accommodated in one of the plurality of the single-wafer type process furnaces 5-1 through 5-n immediately after the transfer of the wafer is completed in the one of the plurality of the single-wafer type process furnaces 5-1 through 5-n. That is, the substrate processing may be simultaneously performed in parallel in the plurality of the single-wafer type process furnaces 5-1 through 5-n. For example, the wafer W accommodated in the single-wafer type process furnace 5-1 is annealed by heating the wafer W by the heater 307 of the single-wafer type process furnace 5-1. That is, an annealing process of the substrate processing is performed to the wafer W accommodated in the single-wafer type process furnace 5-1. In the step S22, the $N_2$ gas serving as the inert gas may be supplied to the wafer W accommodated in the single-wafer type process furnace 5-1. The same also applies to the wafers accommodated in the single-wafer type process furnace 5-2 through 5-n.

For example, process conditions when the wafer W accommodated in the single-wafer type process furnace 5-1 is annealed are as follows:

The process temperature (wafer temperature): 300° C. to 800° C.;

The pressure (an inner pressure of the process chamber 301): 0.1 Pa to 300 Pa;

By selecting suitable values within the process conditions described above, it is possible to perform the desired substrate processing properly.

<Step S23>

When the substrate processing is completed in one of the plurality of the single-wafer type process furnaces 5-1 through 5-n and it is confirmed that the oxygen concentration in the transfer chamber module 8 is maintained equal to or less than 30 ppm, the gate valve 355 of the one of the plurality of the single-wafer type process furnaces 5-1 through 5-n is opened. After the wafer accommodated in the one of the plurality of the single-wafer type process furnaces 5-1 through 5-n is unloaded out of the one of the plurality of the single-wafer type process furnaces 5-1 through 5-n, the gate valve 355 of the one of the plurality of the single-wafer type process furnaces 5-1 through 5-n is closed. The wafer unloaded out of the one of the plurality of the single-wafer type process furnaces 5-1 through 5-n may be stored in the original FOUP 11.

The steps S21 through S23 may be performed in parallel with the step S13. The step S21 may be performed in parallel with the step S14. The step S23 may be performed in parallel with the step S12. In the process module 3B, when the step S23 is completed, the steps S21 through S23 may be performed again to process the next wafer W.

As described above, in the processing apparatus 2, the substrate (wafer) is processed continuously by the vertical type process furnace 4 and the single-wafer type process furnace 5. The substrate processing the single-wafer type process furnace 5 may precede the substrate processing of the vertical type process furnace 4. The substrate processing of the single-wafer type process furnace 5 is not limited to the annealing process. Instead of the annealing process, a process such as a film-forming process, a diffusion process, a dry etching process, an ashing process and a treatment such as a heat treatment may be performed in the single-wafer type process furnace 5 as the substrate processing of the single-wafer type process furnace 5. In order to perform the substrate processing of the single-wafer type process furnace 5, techniques such as the plasmatization of a process gas (e.g., the source gas and the reactive gas) and the high frequency heating may be used. For example, a process such as the smoothing of a surface of a photoresist patterned on the wafer, the correction of an etching resistance and an anisotropic etching of a sacrificial layer may be performed as the substrate processing of the single-wafer type process furnace 5.

Next, the number of stacking stages of the single-wafer type process furnace 5, the number of wafers processed by the single-wafer type process furnace 5 and a process time of the single-wafer type process furnace 5 will be described. A proper number n of the stacking stages of the single-wafer type process furnace 5 is determined by the number of wafers simultaneously processed by the vertical type process furnace 4 and the number of wafers simultaneously processed by the single-wafer type process furnace 5. When the time required for performing the steps S11 through S15 (also referred to as a "batch process time") by the vertical type process furnace 4 is indicated by "$T_a$" and the time required for performing the steps S21 through S23 (also referred to as a "single-wafer type process time") by one of the single-wafer type process furnaces 5 is indicated by "$T_b$", the number of times that the substrate processing can be performed by the one single-wafer type process furnace 5 during the time $T_a$ is calculated as "$(T_a/T_b)$" times. In the embodiments, when the number of the wafers simultaneously processed by the vertical type process furnace 4 is represented by "N" and the number of wafers simultaneously processed by the one of the single-wafer type process furnaces 5 is represented by "M", the number n of the stacking stages of the single-wafer type process furnace 5 may be chosen to satisfy the formula "$n \times M/T_b \geq N/T_a$" so that the single-wafer type process furnace 5 does not limit the throughput of the processing apparatus 2. That is, it is sufficient that the number n is equal to or greater than "$(N/M) \times (T_b/T_a)$". Alternatively, the time $T_b$ may satisfy the formula "$T_a \geq n \times T_b$", or the number M of the wafers may be set so as to satisfy at least the formula "$N \leq n \times M$".

For example, when N is 25, M is 1, $T_a$ is 12 hours and $T_b$ is 80 minutes, then the number n may be set to 3.

In addition, the parameters described above may be set according to the determination of the controller 200. That is, the controller 200 is configured to determine at least one of the parameters described above including the number of stacking stages of the single-wafer type process furnace 5 (that is, n), the number of wafers simultaneously processed by one of the single-wafer type process furnaces 5 (that is, M) and the single-wafer type process time (that is, $T_b$) so as to make it possible to complete the substrate processing of the N number of the wafers (that is, the number of wafers that can be simultaneously processed by the vertical type process furnace 4) in the one of the single-wafer type process furnaces 5 within the batch process time (that is, $T_a$) of the vertical type process furnace 4.

Effects According to the Embodiments

According to the embodiments, it is possible to provide one or more advantageous effects described below.

(1) By employing the configuration in which the vertical type process furnace and the single-wafer type process furnace are provided, it is possible to cope with various operations including the substrate processing of processing the wafer continuously by the vertical type process furnace and the single-wafer type process furnace. In addition, since different substrate processings can be performed in the vertical type process furnace and the single-wafer type process furnace, it is possible to improve the productivity.

(2) By stacking the single-wafer type processing apparatus vertically in multiple stages, it is possible to suppress the increase of the footprint of the processing apparatus and the manufacturing cost of the semiconductor device.

(3) By sequentially processing the substrates processed by the vertical type processing apparatus in parallel with the single-wafer type processing apparatus stacked vertically in multiple stages, it is possible to eliminate (or reduce) the waiting time for the next batch process, and it is also possible to shorten the overall TAT (turnaround time) of the processing apparatus. Therefore, it is possible to improve the productivity.

Modified Example

While the embodiments are described in detail, the embodiments are not limited thereto. For example, the embodiments may be modified in various ways as in the following modified example.

Figure 7:
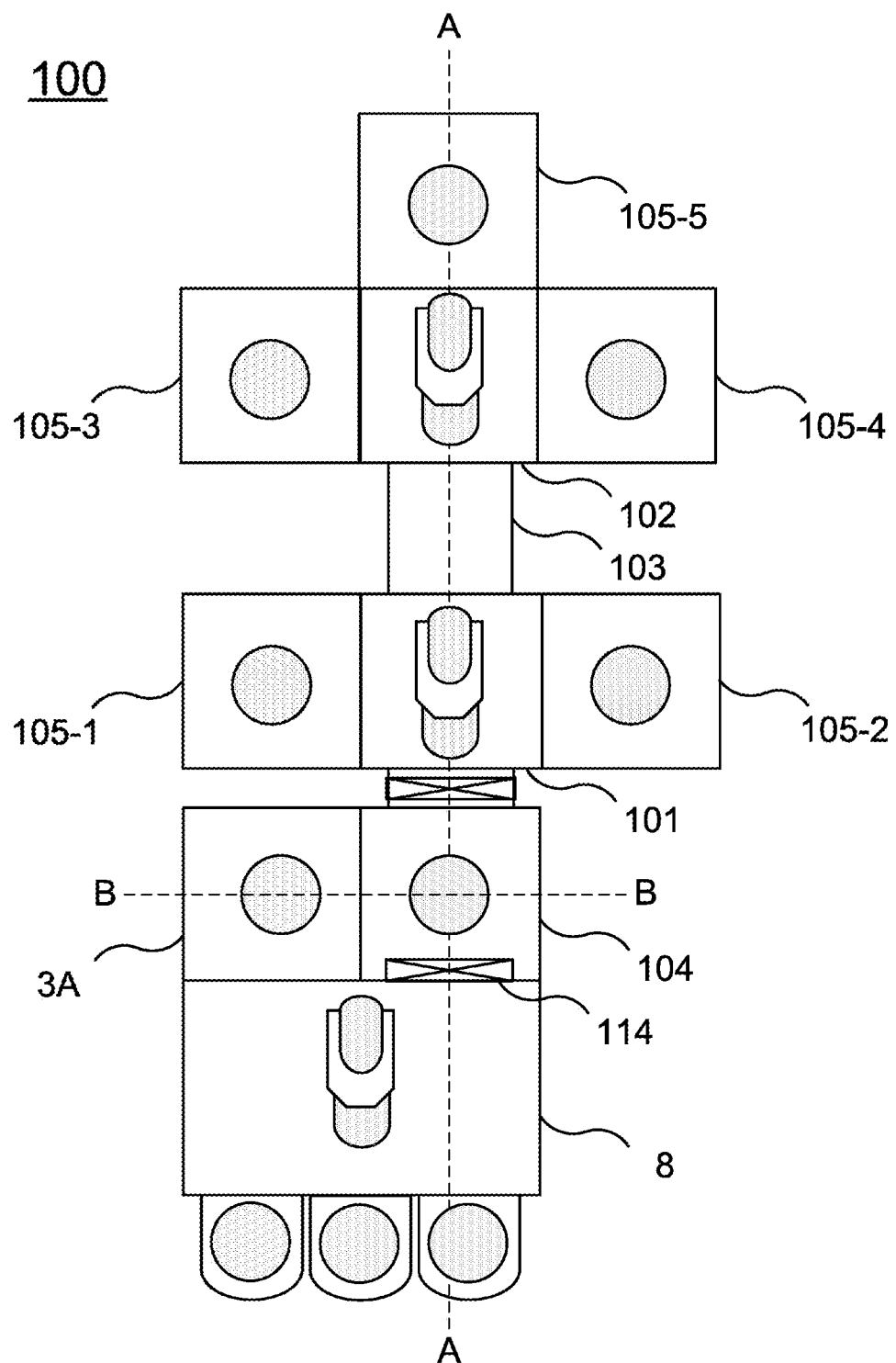
FIG. 7 schematically illustrates a substrate processing apparatus according to a modified example of the embodiments described herein when viewed from above.
Figure 8:
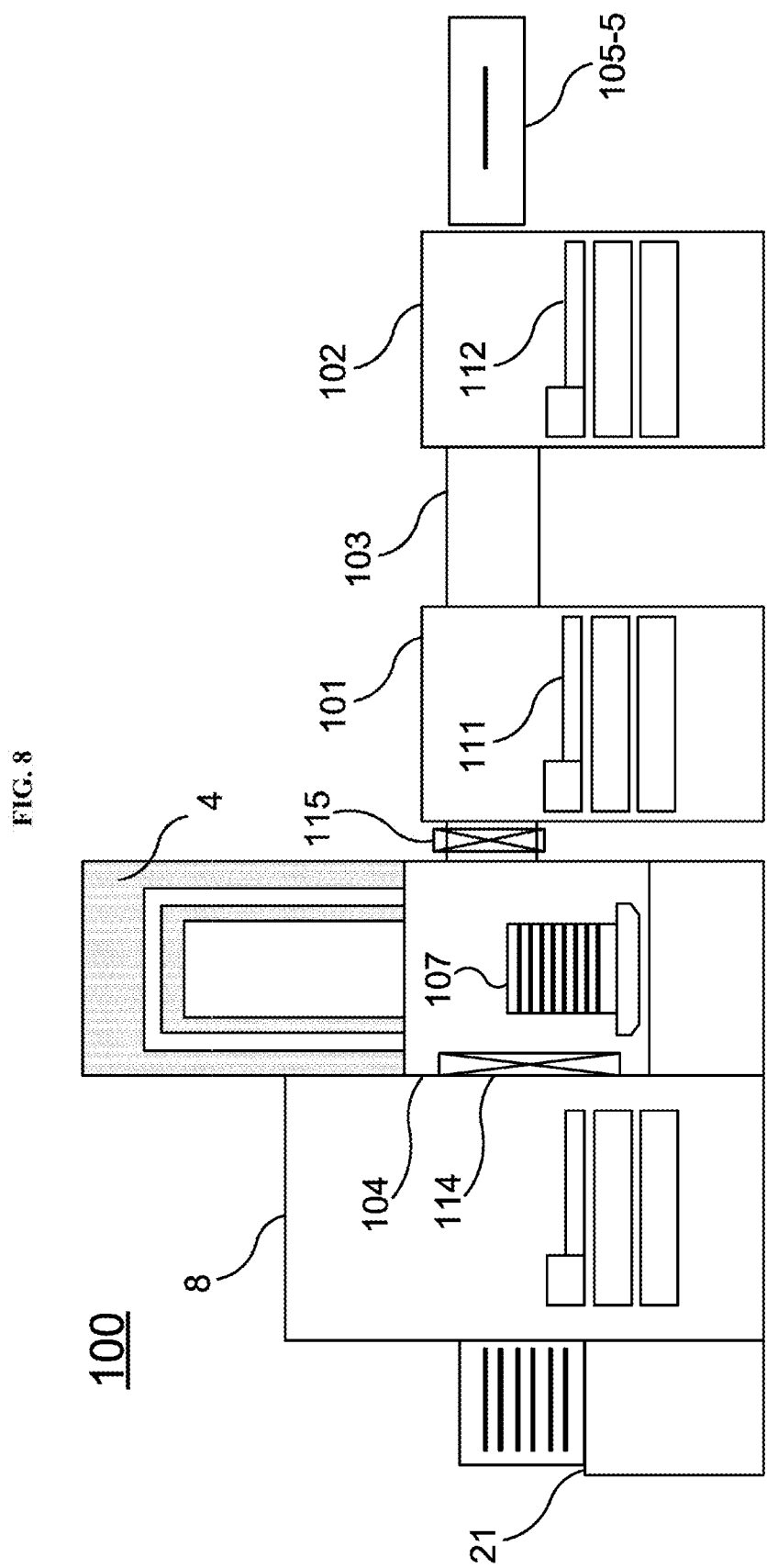
FIG. 8 schematically illustrates a cross-section taken along the line A-A of the substrate processing apparatus according to the modified example shown in FIG. 7.

FIGS. 7 and 8 schematically illustrate a configuration of a substrate processing apparatus 100 according to a modified example of the embodiments described herein. For example, the substrate processing apparatus 100 includes five single-wafer type process furnaces 105-1 through 105-5. The single-wafer type process furnaces 105-1 through 105-5 are connected to one another by transfer chambers 101 and 102 maintained under vacuum and a buffer chamber 103. In addition, the single-wafer type process furnaces 105-1 through 105-5 are connected to the transfer chamber module 8 through a load lock chamber 104. The load lock chamber 104 is disposed adjacent to a side of the process module 3A, and a cassette 107 configured to support N or more wafers is disposed in the load lock chamber 104. The cassette 107 may be elevated or lowered in the load lock chamber 104. A ceiling of the load lock chamber 104 is higher than that of the loading chamber 6 of the process module 3A, and a floor of the load lock chamber 104 is higher than that of the loading chamber 6 of the process module 3A. The load lock chamber 104 is connected to an individually evacuable vacuum pump (not shown). When a gate door 114 is opened to allow the load lock chamber 104 and the transfer chamber module 8 to communicate with each other, an inner pressure of the load lock chamber 104 is at the atmospheric pressure. When a gate door 115 is opened to allow the load lock chamber 104 and the transfer chamber 101 to communicate with each other, the inner pressure of the load lock chamber 104 is in a vacuum state.

Wafer handling robots 111 and 112 capable of transferring the wafers one by one are provided in the transfer chambers 101 and 102, respectively. The buffer chamber 103 is used as a place for exchanging wafers between the wafer handling robots 111 and 112. Each of the single-wafer type process furnaces 105-1 through 105-5 includes a gate valve (not shown) between the transfer chamber 101 or the transfer chamber 102. When the wafer is transferred into or out of each of the single-wafer type process furnaces 105-1 through 105-5, the gate valve of each of the single-wafer type process furnaces 105-1 through 105-5 is opened.

According to the configuration of the modified example, by cascade-connecting the transfer chamber and the buffer chamber, the number n of the single-wafer type process furnaces can be freely set without an upper limit.

As described above, according to some embodiments in the present disclosure, it is possible to process a substrate continuously by a single-wafer type processing apparatus and a vertical type processing apparatus, thereby enhancing the overall productivity of the processing apparatus.

What is claimed is:

1. A substrate processing apparatus comprising:
a vertical type process furnace configured to simultaneously process N substrates accommodated in a substrate retainer, where N is a natural number greater than 1;
a loading chamber provided under the vertical type process furnace and configured to transfer the substrate retainer into or out of the vertical type process furnace;
a plurality of single-wafer type process furnaces provided adjacent to the loading chamber and stacked in at least 2 stages, each of the plurality of single-wafer type process furnaces being configured to simultaneously process M substrates, where M is a natural number less than N;
a transfer chamber module provided adjacent to the loading chamber and the plurality of the single-wafer type process furnaces and provided with a transfer device configured to transfer the substrates; and
a controller configured to operate the vertical type process furnace and the plurality of single-wafer type process furnaces under a condition that a throughput of whole of the plurality of the single-wafer type process furnaces equals or exceeds a throughput of the vertical type process furnace.

2. The substrate processing apparatus of claim 1, wherein the plurality of the single-wafer type process furnaces is disposed within a vertical range whose upper limit is of a same height as or lower than an upper end of the loading chamber and whose lower limit is of a same height as or higher than a lower end of the loading chamber.

3. The substrate processing apparatus of claim 2, wherein the vertical type process furnace comprises an opening provided at a lower end thereof and wherethrough the substrate retainer is transferred into or out of the vertical type process furnace, each of the plurality of the single-wafer type process furnaces comprises a substrate loading/unloading port provided at a side thereof facing the transfer chamber module and wherethrough the substrate is transferred into or out of the each of the plurality of the single-wafer type process furnaces, and the substrate loading/unloading port of each of the plurality of the single-wafer type process furnaces is provided at a position lower than the opening.

4. The substrate processing apparatus of claim 3, wherein N is greater than 5 and less than 51 and M is M.

5. The substrate processing apparatus of claim 4, wherein the substrate loading/unloading port of a lowermost single-wafer type process furnace of the plurality of the single-wafer type process furnaces is disposed at a position as high as or higher than a lowermost substrate of the substrates accommodated in the substrate retainer.

6. The substrate processing apparatus of claim 5, further comprising:
a gate valve provided at a boundary between the loading chamber and the transfer chamber module,
wherein the gate valve is configured to be opened when oxygen concentrations in the loading chamber and the transfer chamber module are equal to or less than 30 ppm.

7. The substrate processing apparatus of claim 6, wherein number of the plurality of single-wafer type process furnaces, number of substrates simultaneously processed by each of the plurality of single-wafer type process furnaces and a process time of each of the plurality of single-wafer type process furnaces are determined such that substrate processing of same number of substrate as those simultaneously processed by the vertical type process furnace is completed in the plurality of the single-wafer type process furnaces within a batch process time of the vertical type process furnace.

8. The substrate processing apparatus of claim 7, wherein substrate processing in the vertical type process furnace is performed in parallel with substrate processing in the plurality of the single-wafer type process furnaces.

9. The substrate processing apparatus of claim 7,
wherein inside the transfer chamber module is filled with an inert gas of generally atmospheric pressure;
wherein the transfer device is an articulated robot provided in the transfer chamber module and configured to be able to access to the N substrates in the substrate retainer unloaded to the loading chamber, the plurality of single-wafer type process furnaces and a pod that is loaded to the transfer chamber module and stores the substrates.

10. The substrate processing apparatus of claim 3, wherein the substrate loading/unloading port of an uppermost single-wafer type process furnace of the plurality of the single-wafer type process furnaces is disposed within a vertical range whose upper limit is lower than the opening and whose lower limit is higher than an upper end of the substrate retainer.

11. The substrate processing apparatus of claim 10, wherein an oxygen concentration in the transfer chamber module is equal to or less than 30 ppm when the substrates are transferred.

12. A method of manufacturing a semiconductor device comprising:
(a) simultaneously processing N substrates accommodated in a substrate retainer by a vertical type process furnace, wherein N is a natural number greater than 1;
(b) transferring the substrate retainer to a loading chamber provided under the vertical type process furnace; and
(c) processing the N substrates by a plurality of single-wafer type process furnaces provided adjacent to the loading chamber, each of the plurality of single-wafer type process furnaces being stacked in at least 2 stages and configured to simultaneously process M substrates, wherein M is a natural number less than N,
wherein (a) and (c) are performed under a condition that a throughput of whole of the plurality of the single-wafer type process furnaces equals or exceeds a throughput of the vertical type process furnace.

13. The method of claim 12, wherein (a) is performed in parallel with (c).

14. The method of claim 12, wherein a number of plurality of single-wafer type process furnaces is equal to or greater than $(N/M)\times(Tb/Ta)$, where Ta represents a time of batch process including (a) performed by the vertical type process furnace and Tb represents a time of single-wafer type process batch process including (c) performed by the plurality of single-wafer type process furnaces.

* * * * *